United States Patent [19]

Jimenez

[11] Patent Number: 5,543,358
[45] Date of Patent: Aug. 6, 1996

[54] METHOD FOR FORMING THIN AND THICK METAL LAYERS

[75] Inventor: Jean Jimenez, Voiron, France

[73] Assignee: SGS-Thomson Microelectronics S.A., Saint-Genis, France

[21] Appl. No.: 345,519

[22] Filed: Nov. 28, 1994

[30] Foreign Application Priority Data

Dec. 3, 1993 [FR] France .................................. 93 14744

[51] Int. Cl.$^6$ .................................................. H01L 21/28
[52] U.S. Cl. ......................... 437/195; 437/187; 437/246; 437/984
[58] Field of Search .................................... 437/192, 195, 437/245, 246, 984, 48, 187; 148/DIG. 102, DIG. 106, DIG. 141, DIG. 105

[56] References Cited

U.S. PATENT DOCUMENTS

| 3,775,838 | 12/1973 | Polmasso | 437/246 |
|---|---|---|---|
| 4,718,977 | 1/1988 | Contiero et al. | 156/652 |
| 5,002,902 | 3/1991 | Watanabe | 437/984 |
| 5,111,276 | 5/1992 | Hingarth et al. | 357/71 |

FOREIGN PATENT DOCUMENTS 4372133  12/1992  Japan .

OTHER PUBLICATIONS

*IBM TECHNICAL DISCLOSURE BULLETIN*, vol. 30, No. 12, May 1988, New York US, pp. 142–143, "Method For Obtaining Low Resistance and Low Capacitance Metalization Using Single Metal Deposition".

Patent Abstracts of Japan, vol. 11, No. 212 (E–522) Jul. 9, 1987 & JP– A–62033425 (Agency Of IND Science & Technology).

*Primary Examiner*—George Fourson
*Assistant Examiner*—Thomas G. Bilodeau
*Attorney, Agent, or Firm*—David M. Driscoll; James H. Morris

[57] ABSTRACT

A method for forming a first metal region of a first thickness, and a second metal region of a second thickness on a substrate, wherein the second thickness is greater than the first thickness. The method includes the steps of depositing a first metal layer of a first thickness; depositing a masking layer of a material selectively etchable with respect to the first metal layers; photoetching the masking layer along an outline defining a first metal regions; depositing a second metal layer; forming a resist layer along an outline defining a second metal region; and etching the first and second metal layers.

27 Claims, 2 Drawing Sheets

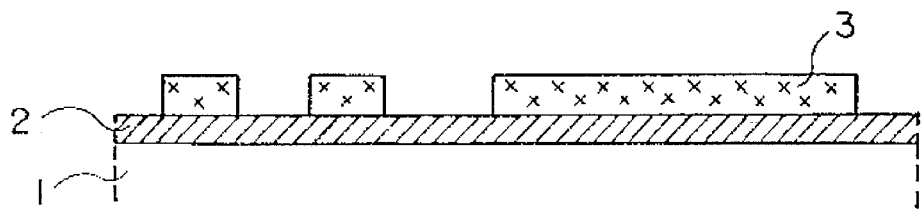
Fig IA
(PRIOR ART)
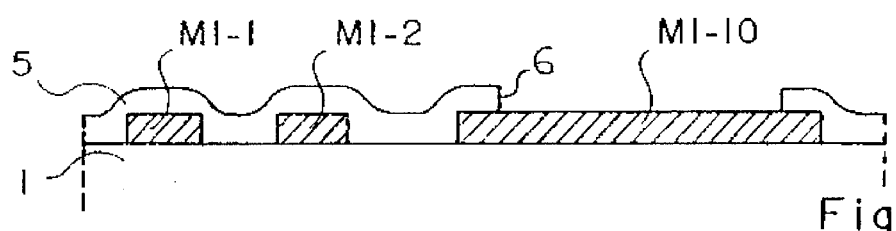
Fig IB
(PRIOR ART)
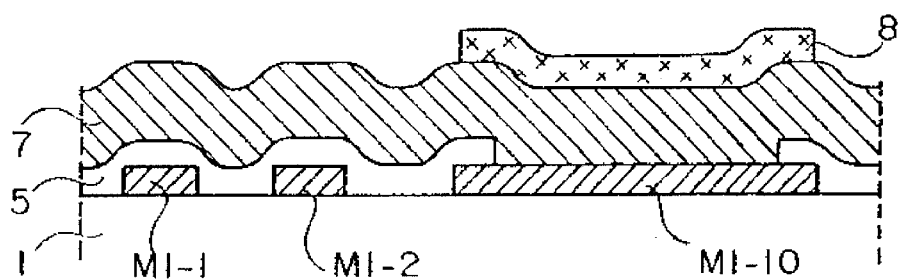
Fig IC
(PRIOR ART)
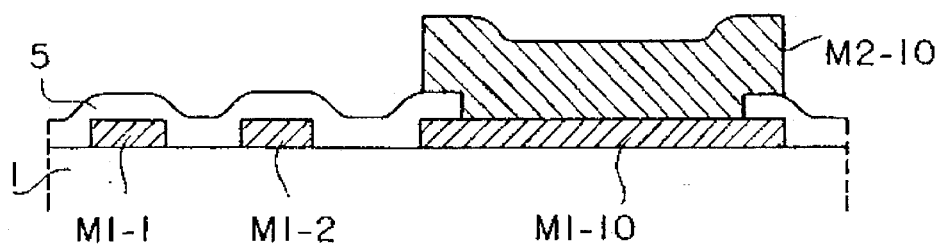
Fig ID
(PRIOR ART)

METHOD FOR FORMING THIN AND THICK METAL LAYERS

BACKGROUND OF THE INVENTION

1. Field of the Invention

The present invention relates to the fabrication of semiconductor components, and more particularly to the fabrication of so-called "Smart Power" components that include power elements, usually vertical MOS transistors, and a control logic portion on the same silicon chip.

2. Discussion Of the Related Art

To produce such components, both power and logic circuit technologies must be used together. This involves in particular major differences in the size of connections, formed as metallizations. In fact, the density of the metallizations in the logic portion of the component must be very high, which requires, for technical reasons, that the metallizations be substantially thin. A rule commonly followed is that the thickness of the metallization must be smaller than one half of its width. This is not a major impairment for metallizations of logic circuits that conduct low currents corresponding to logic signals. In contrast, high currents flow through the metallizations in the power portion of the component which, accordingly, must be wider and thicker than the metallization in the logic portion.

In the prior art, various techniques have been proposed to form "thin" and "thick" metallizations using as few steps as possible. It should be noted that even though reference is made to "thick" metallizations, the invention relates to thin layer technology, that is, these "thick" metallizations have thicknesses ranging from 1 to 4 μm and more frequently from 2 to 3 μm, whereas the so-called "thin" metallizations have thicknesses smaller than 1 μm.

FIGS. 1A–1D illustrate successive steps of a method to form metallizations according to the prior art. These figures are schematic cross-sectional views.

FIG. 1A represents a substrate 1, usually a silicon substrate, in which desired diffused structures have been formed and that may be locally coated with insulation layers, gate regions, etc. A first layer 2 made from a conductive metallic material is deposited on the substrate. The thickness of the first metal layer 2 is designed to form conductive connections for the logic portion of the component. A layer 3, made from a photosensitive material used for photolithography, and hereinafter referred to as a resist layer, is deposited on the first metal layer 2. The first resist layer 3 is formed with regions that substantially correspond to the desired thin and thick connections to be subsequently formed.

As illustrated in FIG. 1B, a photoetching step forms first metal regions M1-1 and M1-2 that correspond to the connections of the logic portion of the component, and a second metal region M1-10 that corresponds to a power portion connection. Thereafter, the first metal regions M1-1 and M1-2 are coated with a protection layer 5; the protection layer 5 having an aperture 6 corresponding to the second metal region M1-10. The formation of the aperture 6 in layer 5 is formed by a resist deposition and photoetching step.

In the step illustrated in FIG. 1C, a second metal layer 7 and a second resist layer 8 are deposited on the substrate 1. The second resist layer 8 is formed to substantially correspond to the second metal region M1-10.

FIG. 1D represents the state of the structure after etching of the second metal layer 7. As shown, portions of the second metal layer M2-10 remain over some corresponding regions M1-10 of the first metal layer.

Thus, this method involves three photoetching steps: a first step for the first metal layer 2, a second step for the protection layer 5, and a third step for the second metal layer 7. As known, an etching operation is relatively difficult to perform and is time consuming. Another drawback of the structure of FIG. 1D is that the material of the protection layer 5 must be selected from among a relatively limited number of materials, if it is desired to maintain the material of the protection layer in place at the final step, because the material then must necessarily be an insulating material. A further drawback of the illustrated method is that the second metallization does not fully cover the first metallization to account for possible misalignment of the masks. As shown in FIG. 1D, the protection layer 5 mush slightly cover the periphery of the first metallization near the second region M1-10. Additional problems are raised if it is desired to eliminate the protection layer 5 because a lateral sub-etching will then occur at the periphery of the metal regions M1-10 and M2-10.

To reduce the number of photoetching operations, it has been proposed in the prior art to remove layers by etching and lifting-off underlying layers, but these steps are difficult to industrially control and cause pollution.

SUMMARY OF THE INVENTION

The present invention is directed at solving the above problems.

A first object of the present invention is to provide a method for manufacturing thin and thick metallizations in which the number of photoetching steps is reduced without replacing conventional steps with complex processes.

Another object of the present invention is to provide a method in which the superposition of the first and second metal layers substantially conform to each other to form the thick regions.

To achieve these objects, the present invention provides a method for forming a first metal region having a first thickness, and second metal region having a second thickness on a substrate, the second thickness being greater than the first thickness. The method includes the steps of depositing a first metal layer of a first thickness on a substrate; depositing a masking layer of a material selectively etchable with respect to the first metal layer; photoetching the masking layer along an outline defining a first metal region; depositing a second metal layer; forming a resist layer along an outline defining a second metal region; etching the first and second metal layers so that the first metal region having a first thickness is formed from the first metal layer coated by the masking layer and the second metal region having a second thickness is formed from the superposition of the first and second metal layers coated by the resist layer.

According to an embodiment of the invention, the step of etching is reactive ionic etching;

According to an embodiment of the present invention, the masking material is SiO$_2$ or tungsten;

According to an embodiment of the present invention, the step of depositing a first and a second metal layer include selecting the composition of each layer from among the group of materials consisting of Al, Al—Ti, Al—Cu, Al—Si, Al—Ti—Si and Al—Cu—Si.

According to an embodiment of the present invention, the step of depositing a second metal layer includes forming the second metal layer with a second thickness greater than the first thickness of the first metal layer.

According to an embodiment of the present invention, the first metal layer is formed with a first thickness less than approximately 1 μm and the second metal layer is formed with a second thickness from approximately 2 to approximately 3 μm.

The foregoing and other objects, features, aspects and advantages of the invention will become apparent from the following detailed description of the present invention when taken in conjunction with the accompanying drawings.

BRIEF DESCRIPTION OF DRAWINGS

In the drawings wherein like reference characters designate like elements:

FIGS. 1A–1D are cross-sectional views of a structure illustrating successive steps of a method according to the prior art.

DETAILED DESCRIPTION

Figure 2A:
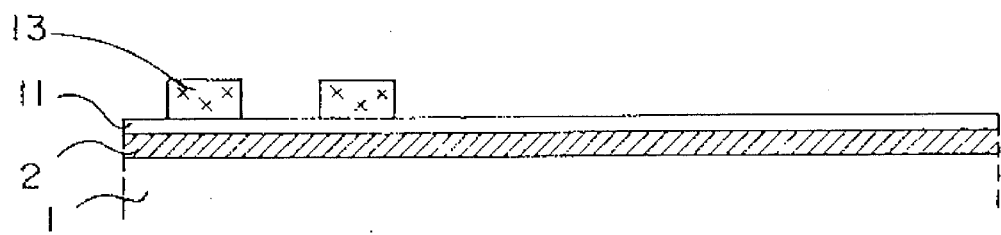
FIGS. 2A–2D are cross-sectional views of a structure illustrating successive steps of a method according to an embodiment of the invention.

In the method according to the present invention as illustrated in FIG. 2A, a first metal layer 2 is deposited on a substrate 1. A masking layer 11, made from a material that is selectively etchable with respect to the metal, is deposited over the substrate 1 and the first metal layer 2. Thereafter, a first resist layer 13 is deposited; the first resist layer 13 is masked and etched so as to leave resist regions only over the first regions where it is desired to form metallizations.

Figure 2B:
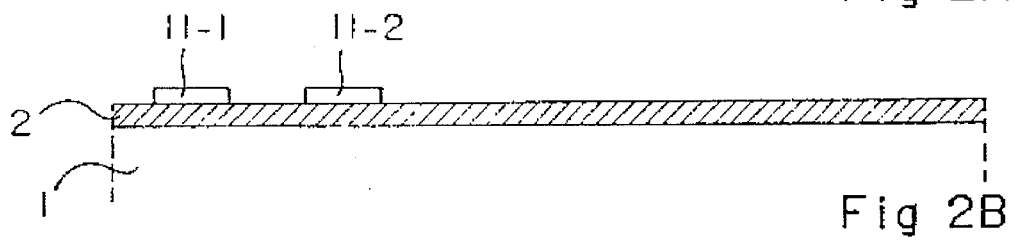
Figure 2C:
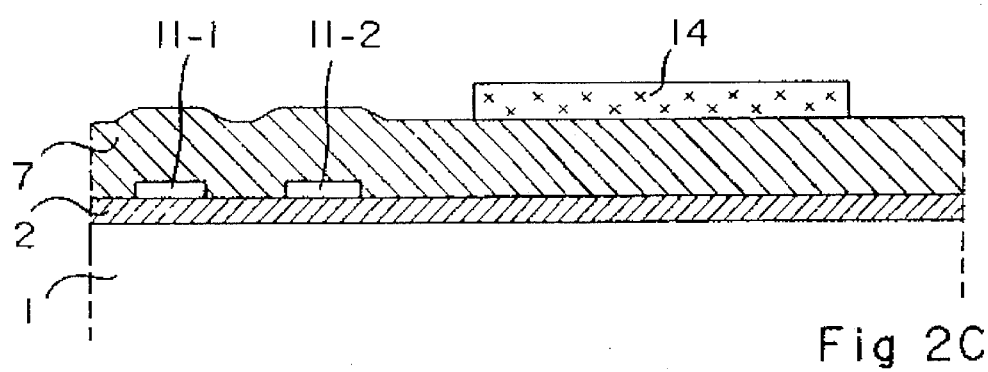

As shown in FIG. 2B, an etching operation is then performed to leave predetermined masking regions 11-1 and 11-2 of the masking layer 11. Masking regions 11-1 and 11-2 are located over the regions where it is desired to form the metallizations. This etching step is accomplished with a process that does not affect the first metal layer 2. As illustrated in FIG. 2C, a second metal layer 7 (that is compatible with but not necessarily identical to the first layer 2) is deposited on the substrate 1. A 15 resist layer 14 is deposited on the second metal layer 7 in second regions where it is desired to form thicker metallizations. Thereafter, an etching step is performed using a process that etches the first and second metal layers without affecting the masking regions 11-1 and 11-2 of the masking layer 11.

Figure 2D:
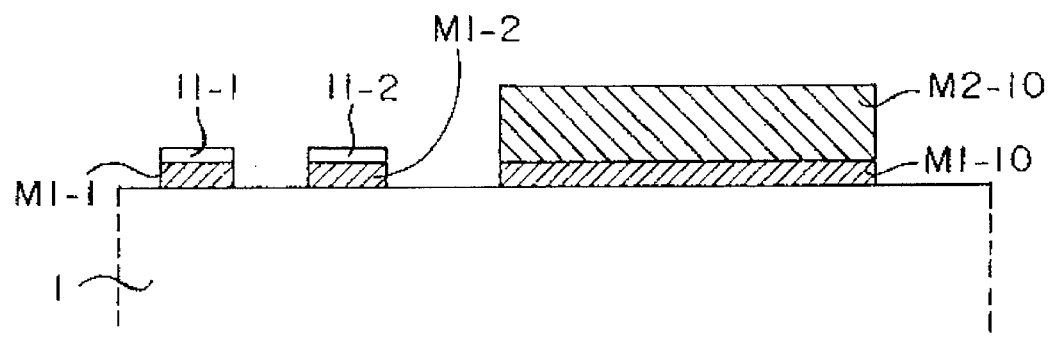

The structure as shown in FIG. 2D is obtained by etching the resist layer 14. This etching process simultaneously forms the thin metal regions M1-1 and M1-2 and the thick metal region M1-10, M2-10 formed by the super-position of regions corresponding to the first and second metal depositions.

An advantage of this method over the prior art method is that it requires only two etching operations as opposed to three. A further advantage of the method according to the invention is that the superposition of the two metal layers substantially conform to each other forming a thicker metallization without a portion of the insulating layer 5 (refer to FIG. 1D) at the periphery of their interface region.

The material for the masking layer 11 should be selectively etchable with respect to the material of the metal layers 2 and 7. Generally, the metal layers that are commonly used for semiconductor metallizations can include aluminum and, if required, alloys of aluminum with another metal, such as copper or titanium, and possibly an alloy of the above mentioned metals with silicon. Thus, these metallizations are, for example, constituted by Al, Al—Ti, Al—Cu, Al—Si, Al—Cu—Si, Al—Ti—Si. Moreover, to obtain vertical openings, one conventionally uses Reactive Ionic Etching (RIE) or Plasma Enhanced Reactive Ionic Etching (PERIE) processes. In these processes, the above-mentioned materials are etched in the presence of chlorine plasma, for example, chlorine or boron chloride. Therefore, the material for the masking layer 11 should be selected from a material that is etchable by wet etching or by ionic reactive etching but in a fluorine plasma, for example, a $CF_4$ or $SF_6$ plasma, taking into account the fact that such fluorine plasmas are not suitable for etching the above mentioned common metal layers.

The material of the masking layer 11 can be either an insulating material such as silicon oxide or a high-melting-material such as tungsten. Since metallizations M1-1 and M1-2 are coated with masking regions 11-1 and 11-2 of this material in the final step, an insulating material or a conductive material should preferably be chosen depending on the steps that are to be subsequently performed during the manufacturing of the component.

Conventionally, the masking layer 11 has a thickness ranging from approximately 0.1 to approximately 0.3 μm, the first metal layer 2 has a thickness less than 1 μm and the second metal layer 7 has a thickness ranging from approximately 2 μm to approximately 3 μm.

The first and second metal layers 2 and 7 can be made of identical or distinct materials. The material of the first metal layer 2 should be selected to provide good adhesion to the underlying layers and good ohmic contact with the silicon or polycrystalline silicon of the substrate where contacts are to be established.

It should be noted that the successive steps provided by the method according to the present invention, and more particularly the final etching step, are compatible with conventional processes for detecting end of etching. More generally, as is apparent to those skilled in the art, various modifications can be made to the above disclosed preferred embodiment without departing from the scope and spirit of the invention. More particularly, these modifications relate to the size of the layers and the materials to be used, as well as to the etching modes.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following fd claims and the equivalents thereto.

What is claimed is:

1. A method for forming on a substrate a first metal region having a first region thickness and a second metal region having a second region thickness, the second region thickness being greater than the first region thickness, the method comprising the steps of:

depositing a first metal layer having a first layer thickness over a substrate;

depositing a masking layer of a masking material over the first metal layer;

photoetching the masking layer along an outline defining the first metal region;

depositing a second metal layer over the photoetched masking layer and the first metal layer;

forming a resist layer along an outline defining the second metal region; and etching the first metal layer and the second metal layer so that the first metal region is formed from the first metal layer where coated by the masking layer and the second metal region is formed from the superposition of the first metal layer and the second metal layer where coated by the resist layer.

2. The method as recited in claim 1, wherein the step of etching is reactive ion etching.

3. The method as recited in claim 1, wherein the masking material is $SiO_2$.

4. The method as recited in claim 1, wherein the masking material is tungsten.

5. The method as recited in claim 1, wherein the step of depositing a first metal layer and the step of depositing a second metal layer include selecting the composition of each layer from among the group of materials consisting of Al, Al—Ti, Al—Cu, Al—Si, Al—Ti—Si and Al—Cu—Si.

6. The method as recited in claim 1, wherein the step of depositing a second metal layer includes forming the second metal layer with a second layer thickness greater than the first layer thickness.

7. The method as recited in claim 6, wherein the first metal layer is formed with the first layer thickness less than approximately 1 μm.

8. The method as recited in claim 6, wherein the second metal layer is formed with the second layer thickness from approximately 2 μm to approximately 3 μm.

9. A method for fabricating a semiconductor chip having metal connections with different thicknesses relative to each other, the method comprising the steps of:

depositing a first metal layer on a substrate;

selectively masking the first metal layer with a masking layer to define a first metal region;

depositing a second metal layer over the masking layer and the first metal layer;

selectively coating the second metal layer with a resist layer to define a second metal region; and simultaneously etching the first metal layer and the second metal layer to form the first metal region and the second metal region that is thicker than the first metal region.

10. The method as recited in claim 9, wherein the step of selectively masking includes etching the masking layer.

11. The method as recited in claim 10, wherein the step of selectively masking includes depositing a masking material on the first metal layer.

12. The method as recited in claim 11, wherein the masking material is $SiO_2$.

13. The method as recited in claim 11, wherein the masking material is tungsten.

14. The method as recited in claim 9, wherein the step of selectively masking includes depositing a masking material on the first metal layer.

15. The method as recited in claim 14, wherein the masking material is $SiO_2$.

16. The method as recited in claim 14, wherein the masking material is tungsten.

17. The method as recited in claim 10, wherein the step of etching the masking layer includes wet etching.

18. The method as recited in claim 10, wherein the step of etching the masking layer includes reactive ion etching in a fluorine plasma.

19. A method for fabricating a semiconductor chip, the method comprising the steps of:

depositing a first metal layer on a substrate;

masking the first metal layer with a masking layer to define a first metal region;

depositing a second metal layer over the masking layer and the first metal layer;

coating the second metal layer with a resist layer to define a second metal region; and etching the first metal layer and the second metal layer to form the first metal region and the second metal region that is thicker than the first metal region, the second metal layer having a second width and the first metal layer having a first width in the second metal region, the second width substantially conforming to the first width.

20. The method as recited in claim 19, wherein the step of masking includes etching the masking layer.

21. The method as recited in claim 20, wherein the step of masking includes depositing a masking material on the first metal layer.

22. The method as recited in claim 19, wherein the step of masking includes depositing a masking material on the first metal layer.

23. The method as recited in claim 19, wherein the step of depositing a second metal layer includes forming the second metal layer with a second layer thickness greater than the first metal layer having a first layer thickness.

24. The method as recited in claim 23, wherein the first metal layer is formed with the first layer thickness less than approximately 1 μm.

25. The method as recited in claim 23, wherein the second metal layer is formed with the second layer thickness from approximately 2 μm to approximately 3 μm.

26. The method as recited in claim 20, wherein the step of etching the masking layer includes wet etching or reactive ion etching in a flourine plasma.

27. The method as recited in claim 19, wherein the step of etching the first metal layer and the second metal layer includes reactive ion etching.

* * * * *